United States Patent
Banister et al.

(10) Patent No.: US 6,452,984 B1
(45) Date of Patent: Sep. 17, 2002

(54) METRIC BIASING FOR MAXIMUM LIKELIHOOD SEQUENCE ESTIMATORS

(75) Inventors: Brian Banister, San Diego, CA (US); Roland R. Rick, San Diego, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/258,032

(22) Filed: Feb. 25, 1999

(51) Int. Cl.[7] ............................................. H03M 13/39
(52) U.S. Cl. ........................ 375/341; 375/262; 714/794; 714/795
(58) Field of Search ................................. 375/262, 265, 375/340, 341; 714/792, 795, 796

(56) References Cited

U.S. PATENT DOCUMENTS

| | | | |
|---|---|---|---|
| 4,742,533 A | * 5/1988 | Weidner et al. | 375/331 |
| 6,205,186 B1 | * 3/2001 | Butler et al. | 375/341 |
| 6,212,664 B1 | * 4/2001 | Feygin et al. | 714/796 |
| 6,215,831 B1 | * 4/2001 | Nowack et al. | 375/340 |

* cited by examiner

*Primary Examiner*—Stephen Chin
*Assistant Examiner*—Chieh M. Fan

(57) ABSTRACT

A decoder for decoding convolutionally encoded precoding data is described. The precoding sequence consists of two subsequences t and b; the value of t corresponds to a convolutional encoder state at a particular time. The a priori probability $Pr(t_i)$ that the subsequence t has a particular value $t_i$ is generated. In the preferred embodiment, the metric function that is applied to a test sequence including $t_i$ is then biased by adding $(\sigma^2/\alpha^2) \ln(Pr(t_i))$, where $\alpha^2$ is the signal average energy per symbol of the transmitted data, $\sigma^2$ is the variance of the noise added by a channel through which the data is transmitted. The resulting metric is then used by an MLSE decoder such as a Viterbi decoder to decode the received data.

12 Claims, 4 Drawing Sheets

METRIC BIASING FOR MAXIMUM LIKELIHOOD SEQUENCE ESTIMATORS

BACKGROUND OF THE INVENTION

1. Field of the Invention

This invention relates to a method and apparatus for decoding convolutionally encoded signals. Such signals are commonly used in communications and recording systems that employ error correction to combat signal corruption.

2. Description of the Related Art

The designers of mobile electronic devices such as cellular phones strive to reduce the power consumption of such devices. Lower power consumption leads to longer battery lives and thus greater convenience, greater reliability and reduced expenses for users of such devices. Therefore, manufacturers seek to differentiate themselves from competitors on the basis of reduced power consumption.

A major determinant of power consumption in cell phones ("mobile stations") is the amount of time the cell phone is actively receiving signals versus the amount of time the cell phone is in "standby mode," in which the mobile's receiver is shut down. It is desirable to increase the amount of time the cell phone is in standby mode.

To reduce power consumption, certain types of cellular phone systems have a "slotted" mode, in which the mobile station "knows" that any messages addressed to it will only be sent during specific frames. (A frame is a group of input symbols that are interleaved). These active frames are herein called the slot, and a slotted mode is one where this information to a specific mobile is transmitted only in that mobile's assigned slot. Thus, the mobile can shut off its receiver for all other frames ("standby mode"). This is a crucial part of power management; therefore, it is highly desirable to increase the time the mobile is in standby mode.

Increasing the time the mobile is in standby mode depends upon, among other things, how much information the mobile must receive, and therefore the amount of time the receiver is on, to correctly process a given piece of data. In turn, the amount of information a mobile must receive to process data is critically dependent upon the coding/decoding scheme employed by the transmitter/receiver system; the mobile's power consumption increases as the amount of information needed by the mobile to decode a given piece of data increases.

Coding/decoding schemes are employed in mobile communications systems to allow a mobile to detect and/or correct errors. (Additional layers of encoding/decoding may be applied for other reasons, such as security). These schemes function by adding some redundancy to information that is to be transmitted.

The redundancy, however, has a cost, in that the mobile must have more information to determine any particular symbol. Therefore, given a particular coding scheme, it is highly desirable to design a mobile that can estimate the desired symbol sequence based upon as little received information as possible, without significantly sacrificing the accuracy of such estimates.

One increasingly popular redundant coding scheme is convolutional coding, in which the coding of a sequence of precoding bits is passed through a shift register, which, at a particular point in time, outputs a certain number of encoded bits based upon the value of that portion of the sequence that is then in the register.

It would be desirable to improve upon conventional maximum likelihood sequence estimation ("MLSE") decoders such as Viterbi decoders, which are commonly used to decode convolutionally encoded data. If $s_k$ is a vector that represents a possible transmitted sequence of symbols and r is a vector that represents the actual signals received by a mobile, a Viterbi decoder effectively tests all of the possible values of $s_k$ and selects the $s_k$ that maximizes the summation $\Sigma_n c[n]r[n]s_k[n]=s_k^T C r$, where $c[n]$ defines the channel gain for a transmitted symbol for sample n (and thus C is a diagonal matrix with these values). (The $s_k$ that maximizes the cross correlation is the $s_k$ that minimizes the "distance" between r and $s_k$.) More generally, MLSE's selects the $s_k$ that maximizes a function of the probability of $s_k$ given r. For more details regarding Viterbi decoders, see, for example, "Digital Communications", John G. Proakis (3d edition 1995).

The best $s_k$ may be represented as a path through nodes in a diagram (known as a trellis), where lines ("transitions") between nodes in adjacent time steps represent whether an input bit (preceding bit) was a 0 or a 1 (for binary coding). The nodes ("states") in vertical columns represent the values of prior input symbols. A "path" through the trellis therefore represents a particular sequence of input symbols. FIG. 1 shows an example of a trellis with only two paths 10 and 12 shown. The time steps indicate a decoder trellis beginning at time t=0 to time t=4. At each time step, the decision units of the decoder contain the value of the cross correlation of the most likely path to the state of interest. Thus, the decoder trellis contains multiple paths from an initial state to a given state several time steps later.

The path that has the highest cross correlation corresponds to the most likely sequence. The most likely path to a particular state within a given time step is found by starting at that particular state at that given time step and tracing backward (a "traceback") along the chosen transitions. Precoding bits that correspond to the transitions along the path are the decoded data. A preceding bit equal to 0 is shown is a solid line; a preceding bit equal to 1 is shown as a dotted line. Thus, path 10 shown in FIG. 1 corresponds to a precoding bit sequence equal to 0100 while path 12 corresponds to a precoding bit sequence equal to 1110.

Given a particular sequence received by a decoder, a metric is generated for possible test sequences, where each test sequence corresponds to a path through a trellis. For a path ending at a particular state at a particular time ("current node"), the corresponding metric is generated by adding (a) the metric for that portion of the path ending at a particular state at the previous time period ("prior node"), to (b) the metric for the transition from the prior node to the current node. (According to the Viterbi algorithm, metrics are generated for all possible paths ending in a current node and the path with the highest metric is the survivor path; the other paths are discarded.) For example, assume that the portion of the path 10 that ends at node 22 in FIG. 1, which corresponds to encoder state B at time t=3, has a metric of 4. If the metric for the transition from node 22 to a node 20 is 2, the metric for the entire path 10 is 6 (=4+2). The path at any given time with the highest metric is the most likely path and is therefore the path that is "traced back."

To achieve good noise performance from the decoding process, the traceback length must generally be several times the constraint length (the number of input bits upon which an output depends; this is one plus the length of a shift register that may be used to perform the encoding) of the code. For example, assume a code with a constraint length of 9 that outputs 2 coded bits for each input bit. If a decoder for such a coding scheme has been running from t=−∞ to t=0 and a traceback is then performed, the last 64 bits might not achieve adequate error performance, while those prior to those 64 will have been accurately decoded. This discrepancy occurs because for the most recent bits there is still subsequent information (that can help to decode those most recent bits) in the not yet arrived signal.

On the other hand, if the decoder must wait for subsequent information, the power consumption of the mobile may be increased. Similarly, power consumption may be increased if, at the beginning of an encoded data stream that a decoder must decode, the decoder must know information transmitted prior to such data. For example, assume there are three frames, and the actual information) intended for the user of the mobile is only in the second frame. Optimally, the mobile should receive only that second frame because reception of the other two frames dissipates power. However, if the decoder must know information from the past frame to decode the start of the present frame, or if the decoder must know information from a subsequent frame to decode the end of the current frame (i.e. tracebacks extend between frames), the mobile's decoder will need to receive information from the first and third frames FIG. 1 illustrates the problems described in the previous paragraph. Assume that the transition from a node at time t=0 to a node at time t=1 is caused by the first precoding bit of a frame which corresponds to the first transmitted bits of that frame. At time t=0, the decoder must know the metric for the paths ending at different states at time t=0; this requires knowledge of transmitted bits from the prior frame. Similarly, if time t=4 is assumed to be the end of a frame, in order to perform a traceback from a subsequent time to time t=4, by definition the decoder must have information after time t=4.

The problem is compounded by the interleaving of frames: an entire frame must be received and deinterleaved before it is available for decoding. Therefore, if tracebacks extend between frames, for systems with deinterleaving, the first and third frames must be received in their entirety to properly decode the second frame; the receiver consumes power when it receives the first and third frames.

As an example of the above mentioned problem, FIG. 2 shows a timeline of mobile station activity for one type of slotted mode system. As shown, a mobile unit is allocated a particular slot comprising four frames. Outside of the slot, no end user information for the mobile is transmitted. To conserve power, it is desirable to require the mobile to receive as little as possible of the signal outside of the slot. However, as previously described, due to the nature of interleaving and convolutional codes, some types of conventional mobiles often must receive the frame before frame 1 to decode frame 1 and also must receive the frame after frame 4 to decode frame 4. This is highly undesirable from a power consumption standpoint.

"Tailed" convolutional codes are a conventional method for eliminating the requirement that prior and subsequent frames must be received before a present frame may be decoded. In a tailed convolutional code, a "tail" is added to the input bit stream (i.e. prior to encoding) at the end of every frame or some subset of frames. The tail would commonly be K−1 zeros, where K is the constraint length of the code and thus K−1 is the number of registers in an encoder's shift register. Thus, for a code with a constraint length of 9, the state at the end and beginning of a frame is known to be [00000000]. Since the state at the beginning of the current frame is known, there is no need to receive the prior frame.

In addition, since the state at the end of the frame is known, there is no need to receive the subsequent frame (and thus no need to perform a traceback from the subsequent frame into the current frame to decode the portions, especially end portions, of the current frame). In other words, an entire current frame can be optimally decoded as soon as the last symbol of the frame is received. For example, if the decoder knows that the encoder was in the state A (node 14) at time t=0 in FIG. 1, then there is no need to perform a traceback to nodes at times t<0.

Instead of a full tail as discussed above, some systems add a partial tail where the number of zeros appended to a frame is less than K−1. In this case the start and end states for a frame are not known, but a large subset of the states can be discarded as impossible. For example, if 4 tail bits are added using the example code discussed above, then only 16 out of the full set of 256 states are possible. These states may be denoted [0000xxxx] where the digits to the right are the earlier precoding bits inserted into the shift register. If a prior frame is not received, tracebacks can end only in one of these possible states. In this case, decoding will be faster because the prior frame need not be received but performance will be sacrificed.

Although tailed convolutional codes enable a receiver to decode a frame without having to receive prior and subsequent frames, some popular systems do not employ tailed convolutional codes in all circumstances. For example, the IS-95 standard provides for tailing during "traffic" mode but not during "paging" mode. Nonetheless, to avoid having to receive subsequent and prior frames, some receivers assume that a fixed tail has been applied, which, if that is not the case, results in a relatively higher error rate.

Therefore, it would be desirable for a receiver to have the capability to decode a present frame with an acceptable error rate, without having to receive prior or subsequent frames, for a non-tailed or only partially tailed convolutional code.

SUMMARY OF THE INVENTION

These and other needs are met by the present invention, which provides a method and apparatus for decoding transmitted data that has been generated by encoding precoding bits with a convolutional encoder that generates convolutional codes based on an input sequence of precoding bits, where the encoder has a constraint length K and a rate k/n.

In the preferred embodiment, the decoding of received data is performed by receiving a sequence of data r which resulted from the encoding and transmission of a preceding sequence through a channel and the reception of that sequence. The preceding sequence consists of two subsequences t and b; the value of t corresponds to an encoder state at a particular time. For example, t may be the last K−1 precoding bits of a prior frame while b may be all of the preceding bits of a present frame. The a priori probability $Pr(t_i)$ that the subsequence t has a particular value $t_i$ is generated. In the preferred embodiment, the metric function that is applied to a test sequence that includes $t_i$ is then biased by adding $((\sigma^2/\alpha^2) \cdot \ln(Pr(t_i))$, where $\alpha^2$ is the signal average energy for each symbol of the transmitted data, $\sigma^2$ is the variance of the noise added to a symbol by a channel through which the symbol is transmitted. The resulting metric is then used by an MLSE decoder such as a Viterbi decoder to decode the received data.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

An improved MLSE decoder is shown in the context of a wireless communication system with mobile units operating in a slotted mode, as will be further described below. However, it will be appreciated that the present invention is not limited to such systems. The MLSE encoder that is described is a Viterbi decoder but the invention may be applied to any type of MLSE decoder. Similarly, for purposes of illustration, the present invention is described with reference to an encoding scheme wherein one precoding bit input into an encoder causes a state change (i.e. rate 1/n encoders). It will be appreciated that the present invention may be applied to data encoded by encoders with any possible rate, k/n.

As used herein, the "value" of a sequence is simply the composition of that sequence. For example, the value of the sequence "0010" is 0010. As used herein, a "precoding bit" is a bit that is provided as in input to a convolutional encoder. A version of a preceding bit means any signal, however processed (including by a convolutional encoder), generated from that precoding bit.

A "metric" is a statistic generated from data for the purposes of making a decision with regard to such data. A metric is generated by applying a "metric function" to particular data.

A "symbol" is one soft decision that is provided as an input to a decoder.

General System Description

Figure 3:
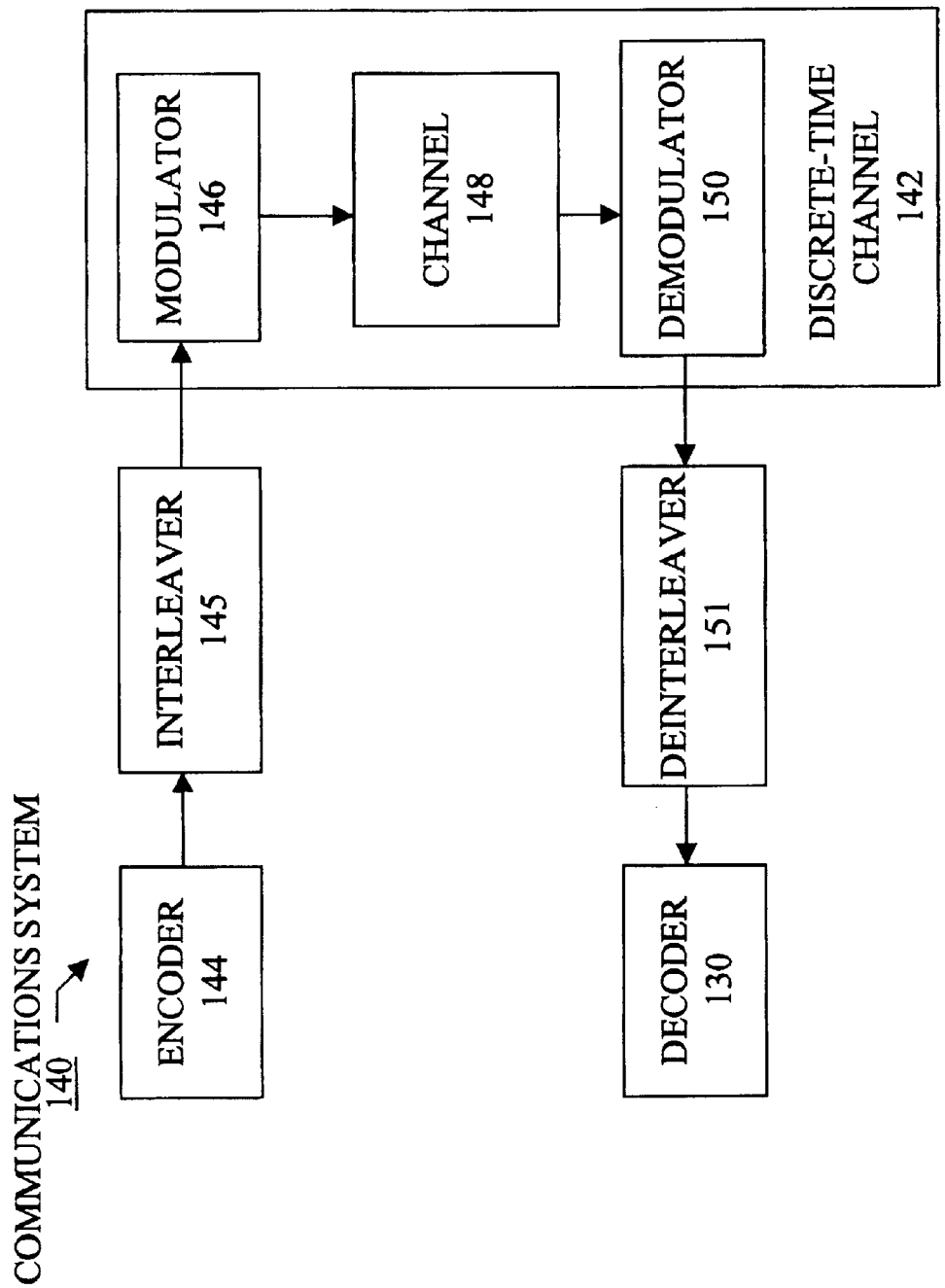
FIG. 3 represents a digital communications system comprising a discrete-time channel interposed between an encoder and a decoder.

FIG. 3 represents a digital communications system 140 comprising a discrete-time channel 142 interposed between an encoder 144 and a decoder 130. Discrete-time channel 142 comprises a modulator 146, a channel 148 and a demodulator 150. An interleaver 145 is interposed between the encoder 144 and the modulator 146. A deinterleaver 151 is interposed between the decoder 130 and the demodulator 150. Channel 148 may be a transmission channel or a storage medium being written to and read from. Interleaver 145 receives a digital output signal from encoder 144 and interleaves this digital output signal over a certain time period, which is usually predetermined and known as a frame. Modulator 146 serves to translate the digital output signal from interleaver 145 into signals suitable for channel 148 and thereafter drives the signals across channel 148.

Channel 148 may suffer from degradation that corrupts said signals, the degradation possibly taking form in any combination of additive noise, cross channel interference, multi-path interference, channel fading and other forms of degradation. Demodulator 150 serves to receive the signals from channel 148 while minimizing the interference as much as is practical, and thereafter translate the signals into digital signals for input to deinterleaver 151, which deinterleaves the digital signal and provides it to decoder 130. Discrete-time channel 142 can thus be viewed as a unit accepting digital input signals and producing possibly corrupted digital output signals although the present invention is not limited to noisy channels.

Encoder 144 is a convolutional encoder which serves to add redundancy to input data signal 152. In particular, the encoder 144 comprises a shift register coupled to various arithmetic units (such as modulo 2 adders) that form n bits of output based on the precoding bits in the shift register. For a simple shift register, where each shift of the register causes one bit to be shifted in and out of the register (i.e. each precoding bit is shifted to the next location in the register) each input bit corresponds to n bits of encoder 144 output and 1/n is known as the rate of the encoder 144. If the shift register has K elements, the K−1 most recent bits input into the encoder correspond to a state. K is known as the constraint length. For binary input data, there are therefore $2^{K-1}$ possible encoder states.

The added redundancy (n bits per precoding bit) allows for detection and correction of errors that may result from corruption of signals passing across discrete-time channel 142. The error detection and correction is performed by decoder 130.

As described above, MLSE decoders such as decoder 130 decode received data provided by demodulator 150 by finding effectively testing possible transmitted sequences $s_k$ and selects the $s_k$ that maximizes the metric of $s_k$ given received data r. According to the present invention, a preferred metric function will now be described in the context of a slotted mode system. In particular, a preferred metric function will be described where it is desired to decode a present frame without receiving a previous frame. (The present invention is not limited to slotted mode systems.)

Let the subsequence consisting of the final K−1 precoding bits of a previous frame for a $k^{th}$ test sequence $s_k$ be denoted $t_i$, and the precoding bits of the present frame which would give rise to a transmit signal equal to $s_k$ be denoted $b_j$. Thus, the transmit signal that would be generated by encoder 144 is equal to the test sequence $s_k$ (which is hereafter referred to as $s_{ij}$) when the last K−1 precoding bits of the previous frame are those given by $t_i$ and the subsequent precoding bits of the present frame are given by $b_j$. Assuming that all of the precoding bits outside of the subsequence $t_i$ are ones with probability 0.5 (although the present invention is no so limited), so that all sequences $b_j$ are equally probable, $$Pr(b_j)=P \text{ for some } P \text{ which is independent of } j$$

and $$Pr(s_{ij})=Pr(b_j, t_i)=Pr(t_i)\cdot P;$$

which assumes, for the purposes of the preferred embodiment, that $b_j$, $t_i$ are statistically independent. According to the present invention, a possible initial metric function is:

$$M_{ij}=s_{ij}^T Cr+\sigma^2\cdot ln(Pr(t_i))+\sigma^2\cdot ln(P);$$ where $\sigma^2$ is the variance of the noise added by the channel 148 to each symbol.

Since in the preferred embodiment P is the same for all sequences, the above equation may be simplified as follows:

$$M^{(1)}_{ij}=s_{ij}^T Cr+\sigma^2\cdot ln(Pr(t_i))$$

Finally, in a practical system there is a finite dynamic range of operation for the decoder 130. Typically gain is applied to the signal to bring the metrics to within the decoder dynamic range. For simplicity, it is assumed that gain operates on the signal in the absence of noise. If v is the noise added by the channel 148, then $$r=Cs_{ij}+v$$

so that the signal average energy level per received symbol is $$\alpha^2 = 1/N \cdot s_{i,j}^T CC s_{i,j}$$
$$= 1/N \, tr(C^2)$$

Then, in a preferred embodiment, the metric function applied by the decoder 130 is:

$$M_{ij}=(1/\alpha^2)s_{ij}{}^T Cr+(1/\alpha^2)\sigma^2 \cdot \ln(Pr(t_i))$$

Thus, the metric function for a test sequence $s_{ij}$ that corresponds to an encoded version of a preceding sequence that includes the sequence $t_i$, is a function of the a priori probability of the occurrence of $t_i$.

The generation of $Pr(t_i)$ will be described below. In general, $\sigma^2$ will not be exactly known, because it is a time varying quantity based on the changing channel characteristics. It is possible to develop an algorithm for estimating this value to determine the exact weighting to apply to the log probability, but in the preferred embodiment a single value is chosen. Note that if a single fixed value is selected, then performance will not be optimal when the noise energy is not the same as selected. When the actual noise is less than that selected, there will be an undue tendency towards selecting the more probable initial states, and vice versa. The best way to select this quantity would be to determine some threshold level of signal to noise for which to optimize. The selection of this level is very system dependent.

Figure 1:
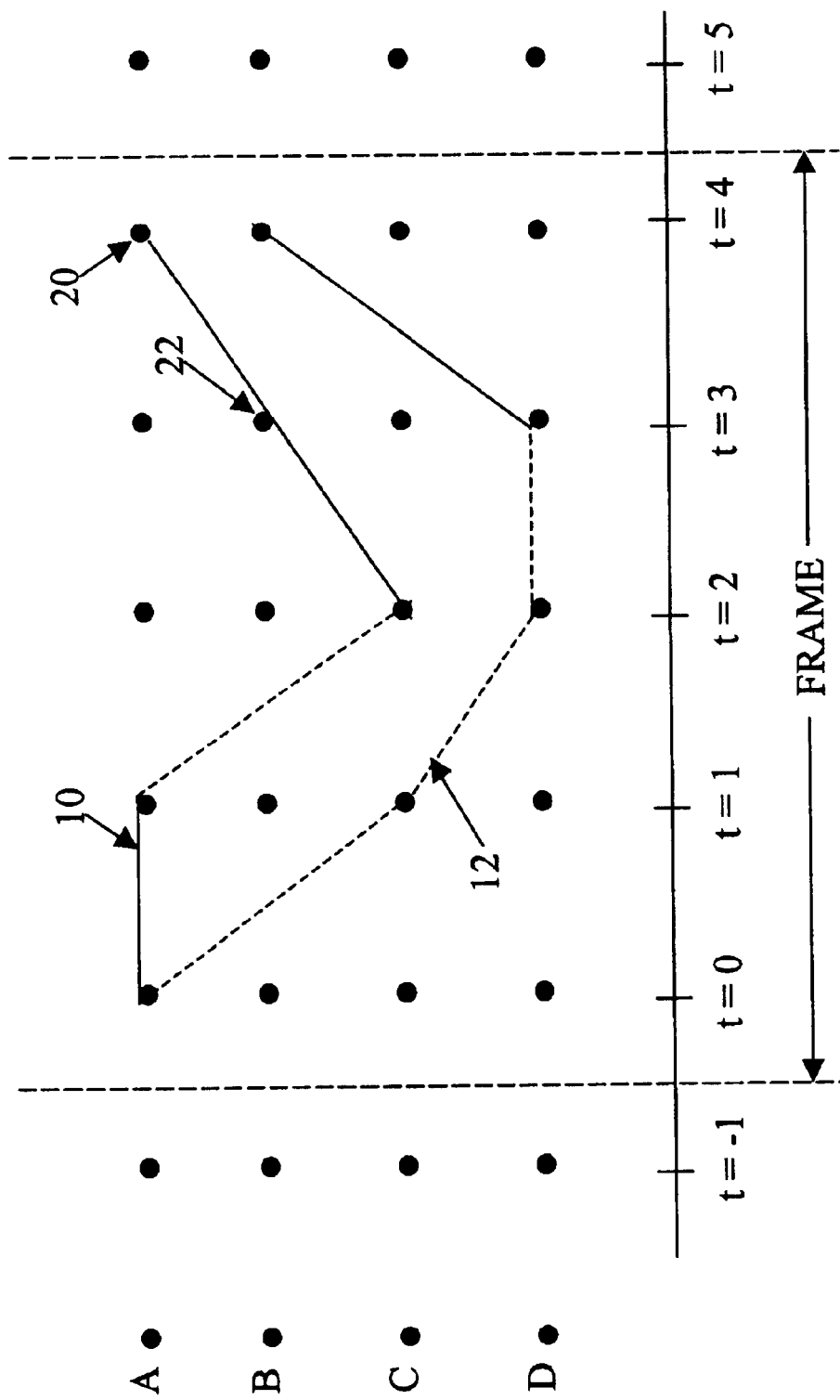
FIG. 1 is an example of a trellis diagram.

Essentially, the above described metric function adds a bias term $(1/\alpha^2)\sigma^2 \cdot \ln(Pr(t_i))$ to nodes corresponding to initial possible states at the beginning of a frame (e.g. states at time t=0 in FIG. 1), where each $t_i$ corresponds to one of those states. The bias term essentially serves to initialize a trellis at time t=0; without the bias term, if the previous frame is not received, these trellis nodes at time t=0 would all be set to 0, resulting in a relatively higher error than if the biasing is applied.

Although the above discussion describes a biased metric function for the initial states of a frame, biasing may be applied any time there is some sort of a priori knowledge with regard to the precoding bits that correspond to states at a particular time. For example, when such a priori knowledge exists with regard to the tails of a frame, biasing may be applied to the final states of that frame; such biasing would be particularly helpful when it is desired to decode that frame without receiving the subsequent frame.

Flow Chart of Operation

Figure 4:
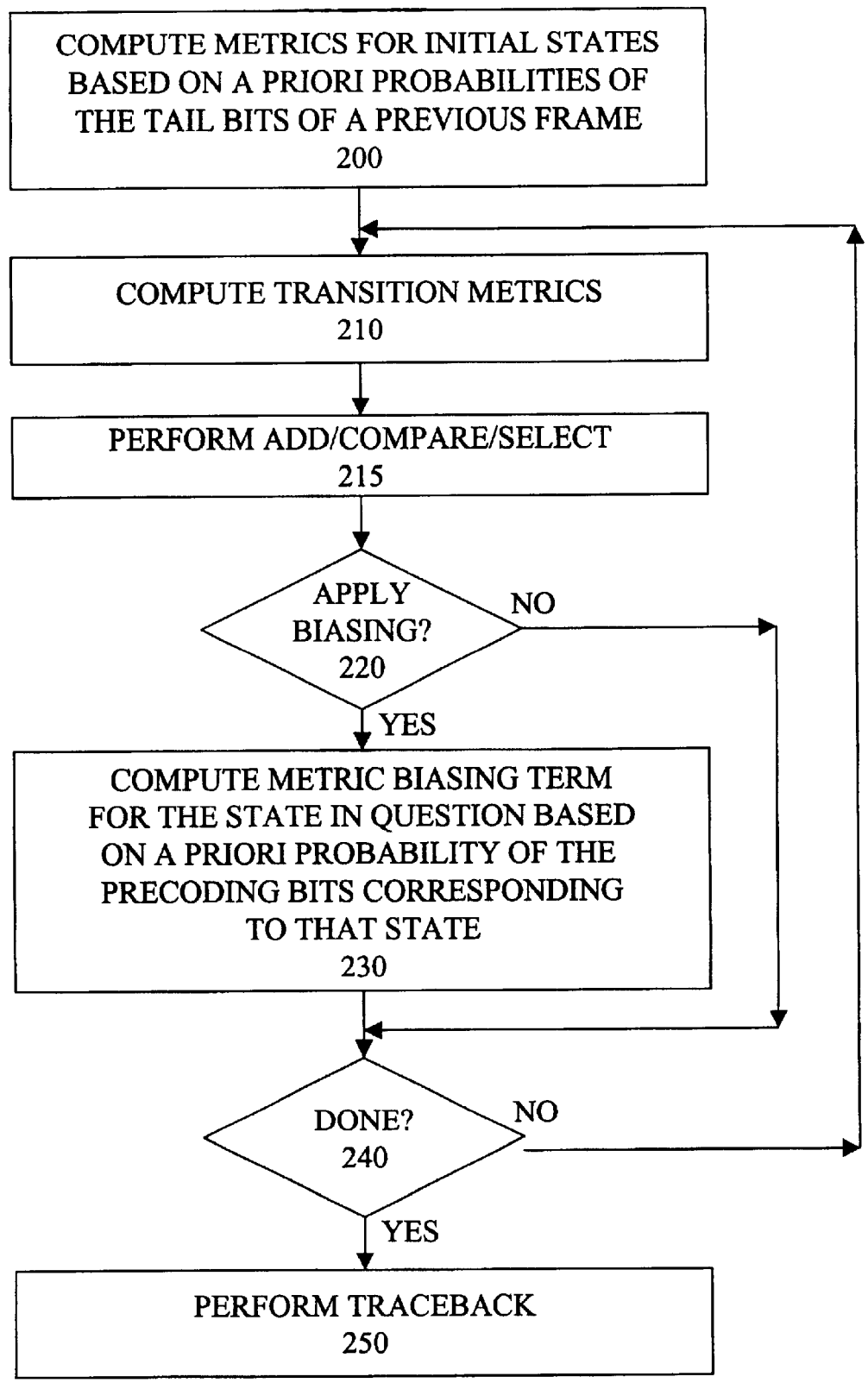
FIG. 4 is a flow chart that details the operation of a biased metric function generator that comprises part of the decoder shown in FIG. 3.

FIG. 4 is a flow chart that details one way that the decoder 130 may compute the above described preferred metric function. The decoder 130 is assumed to have received data r and decoding is assumed to proceed in one direction, from earlier times to later times, although it will be appreciated that decoding may proceed in the opposite direction. In block 200, "metrics" are generated for the initial states in a frame (e.g. states at time t=0 in FIG. 1) where a previous frame has not been received. (The present invention is not limited to systems that do not receive previous frames.). In particular, for each state, the preferred bias term $(1/\alpha^2)\sigma^2 \cdot \ln(Pr(t_i))$ is generated, where $t_i$ consists of the precoding bits that would have given rise to the state in question. As previously described, the bias term serves to initialize a trellis.

In block 210, the metrics for transitions between adjacent states (e.g. state A at time t=0 to state B at time t=1 in FIG. 1) are generated. In block 215, an add/compare/select operation is performed. In particular, transition metrics are added to the metric for the node from which the transition emanated (e.g., continuing with the above example, state A at time t=0). (More formally, the metric for a node is the maximum metric for a path (test sequence) that ends in that node, except for nodes at time t=0, which do not have paths extending to times t<0). For a particular node, the metrics of the paths ending in that node are compared and the path with the highest metric is selected as the survivor path for that particular node.

In block 220, the decoder 130 determines whether metric function biasing may or should be applied to a node (i.e. a particular state at a particular time). For example, if the decoder 130 is at the end of a frame and there is a priori information regarding the tail of that frame, metric function biasing may be applied to states at the end of the frame (e.g. states at time t=4 in FIG. 1). If biasing is to be employed, control passes to block 230, where $(1/\alpha^2)\sigma^2 \cdot \ln(Pr(t_i))$ is computed and the result added to the metric for the particular state in question (more formally, in the preferred embodiment, the result is added to the metric for the survivor path ending in the node in question), where $t_i$ is the sequence of K−1 preceding bits that would cause the encoder 144 to be in that particular state.

If biasing is not applied, control passes from block 220 to block 240. If biasing was applied, control passes from block 230 to block 240. Block 240 loops back to block 210 until an entire frame (or frames) has been completely decoded. As shown in block 250, the decoder 130 selects the path (test sequence) with the highest metric and performs a traceback through the path to decode the received data r.

Since, in the preferred embodiment, biasing is applied to some states (e.g. states at time t=0) and not others, different subpath metric functions have effectively been applied to different portions of a test sequence. For example, a metric function that includes a biasing term is applied to a first portion of a test sequence that corresponds to a subpath (i.e. part of a path for the entire test sequence) that starts at a node at time t=0 in FIG. 1 and ends at a node at time t=1 while, typically, a subpath metric function that does not include that bias term is applied to a second portion of a test sequence that corresponds to a subpath from a node at time t=1 in FIG. 1 to a node at time t=2. Each of these different subpath metric functions is applied separately to one of the portions of the test sequence and the resulting metrics effectively added together by the operation of decoder 130 (if a path comprising the above two subpaths is a survivor path) such that the preferred (overall) metric function, as described above, is effectively applied to the entire test sequence.

Generation of A Priori Probability

The a priori probability that a sequence of precoding bits has a particular value may either be known or estimated by the decoder 130. As used herein, "generation" of an a priori probability encompasses both of these cases.

As will be further described below, in some systems, the end of a frame (before coding) is often padded with 0's. In such systems, the decoder 130 may be able to generate an a priori probability that the last K−1 preceding bits of a previous frame had a certain value, and thus that the encoder 144 was in a certain state at the beginning of a current frame (e.g. time t=0 in FIG. 1). If it is assumed that the deviation from equally probable precoding bits arises only in the form of a random number of zeros appended to the end of a frame and not a generalized change in the probability distribution, there are $2^{K-1}$ possible initial states but there are actually only K possible distinct values of the probability for an initial state.

For example, assume a constraint length K equal to 9 although it will be appreciated that the present invention is not limited to any particular constraint length. Let N be the total number of consecutive zeros (after a 1) at the end of a frame, which is random from 0 to 8. Assume that outside of the random length tail of zeros the bits are 0,1 with equal probability. Then, with the last bit entered into a shift register (which is part of the encoder 144) being the left most of the given vector, the probabilities for the subsequence t are:

| | |
|---|---|
| $Pr(\underline{t} = [00000000]) = Pr(N = 8)$ | (1 such state out of the 256 states) |
| $Pr(\underline{t} = [00000001]) = Pr(N = 7)$ | (1 such state out of the 256 states) |
| $Pr(\underline{t} = [0000001x]) = Pr(N = 6)/2$ | (2 such states out of the 256 states) |
| $Pr(\underline{t} = [000001xx]) = Pr(N = 5)/4$ | (4 such states out of the 256 states) |
| . | |
| . | |
| . | |
| $Pr(\underline{t} = [1xxxxxxx]) = Pr(N = 0)/128$ | (128 such states out of the 256 states) | where $$\Sigma_{n=0:8} Pr(N=n)=1$$

Frequently, even where a fixed tail is not applied for each frame, it is still more probable that the last few bits of a frame are zeros than ones. This is true in many frame based systems. If all messages start synchronized to a frame, then zero padding bits are required to fill the space from the end of one message to the beginning of the next frame. If not all messages are frame synchronized, then the slotted operation still requires in general that the first receivable message after the beginning of the slot is synchronized, since without some such synchronization method the mobile cannot determine the start time of the first message.

The values for Pr(N=1) can be worked out once and assumed fixed, or the mobile station can have some sort of training period where it monitors the received frames to adaptively estimate these probabilities. This would then be periodically updated.

Finally, unless it is known for certain that N is always greater than some known number M (i.e. Pr(N=i)=0; i≦M), applying a probability approaching zero should not be done. Since ln(0)=-∞, any probability approaching zero will introduce a bias approaching -∞, making it impossible for a MLSE to ever choose that initial state. Thus, if the probability is not known to be 0, in practice, a floor probability $P_{floor}$ should applied such that, if the calculated probability $P_{calc}$ is less than $P_{floor}$, for purposes of computing the preferred biasing metric function, $(1/\alpha^2)\sigma^2 \ln(P_{floor})$ should be used rather than $(1/\alpha^2)\sigma^2 \ln(P_{calc})$.

If on the other hand it is known that the probability that the encoder 144 was in a certain state at a certain time is 0, then, as with conventional partially tailed convolutional codes, a large negative metric may be assigned to the node corresponding to that state at that time to effectively ensure that the node is not part of a survivor path.

Although the above discussion has referred to the calculation of the probabilities for the last K-1 bits of a frame, as previously described, it will be appreciated that the present invention has applicability whenever the decoder 130 can obtain a priori information regarding the probability that preceding bits have a certain value. It will also be appreciated that the present invention is in no way limited to systems that have "frames."

Slotted Mode Systems

Figure 2:
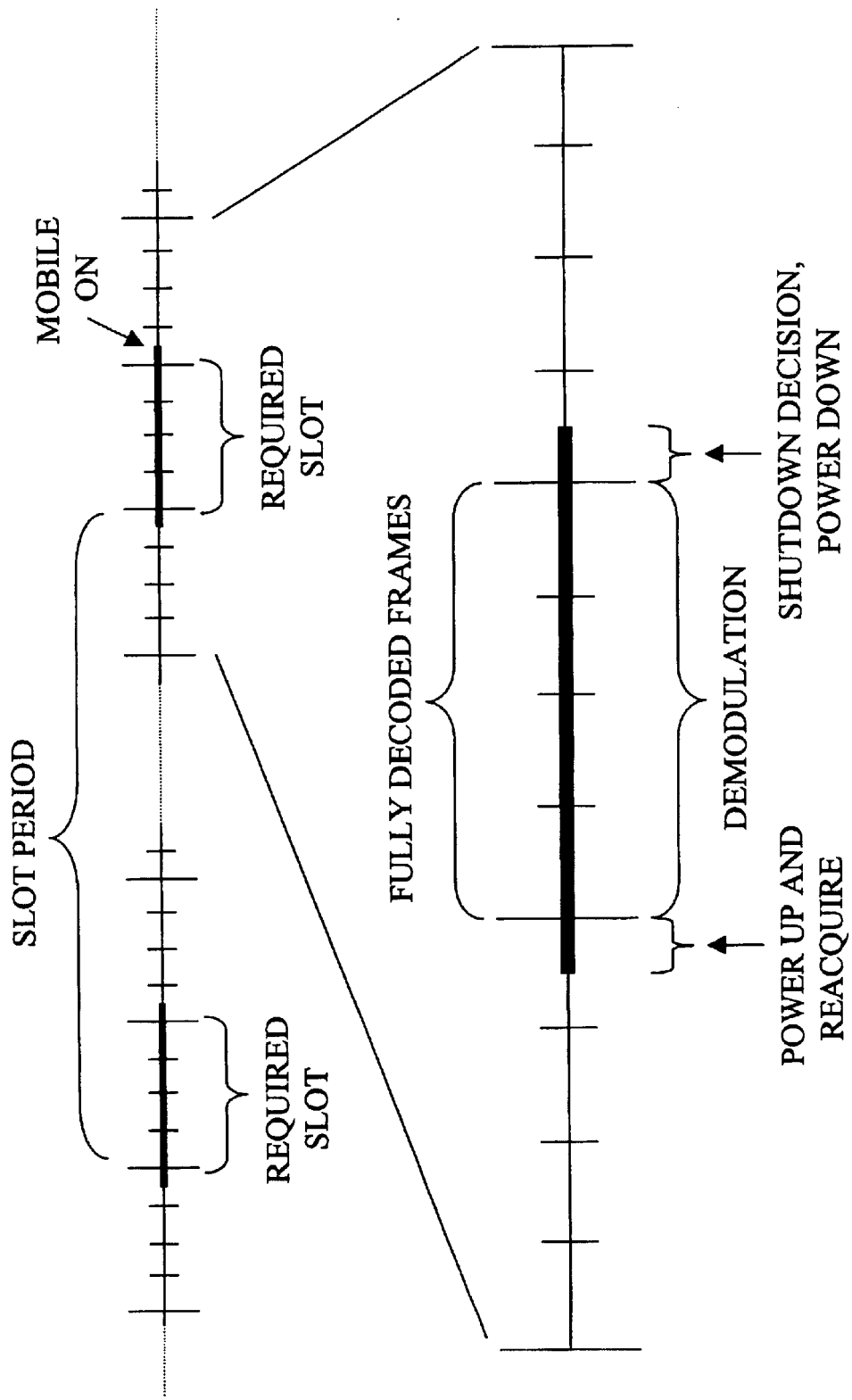
FIG. 2 shows a timeline of mobile station activity for one type of slotted mode wireless communications system.

The present invention has applicability to any type of system that employs an MLSE where a priori probabilities may be generated. One example of a system where the present invention may be employed is a slotted mode communications system such as a system shown in FIG. 2. The previously described metric function biasing may be used for every frame or less frequently, such as only once for every slot (e.g. every $4^{th}$ frame). In either case, appropriate metric function biasing can be applied to the start of the slot to allow the mobile to decode the first frame without the aid of a prior frame. If a priori probabilities may be determined only for the tail of the last frame of a slot, then each frame in the slot must be processed with a frame delay to allow the required traceback between frames, if each frame is decoded in its entirety. Then the final frame of the slot can be decoded as soon as it is received by applying the appropriate metric function biasing.

Conclusion

Numerous variations and modifications will become apparent to those skilled in the art once the above disclosure is fully appreciated. It is intended that the following claims be interpreted to embrace all such variations and modifications.

What is claimed is:

1. A method for decoding received data that has been generated by encoding a sequence of precoding bits with a convolutional encoder that generates convolutional codes based on an input sequence of precoding bits, the encoder characterized by a constraint length K and a rate k/n, the method comprising the steps of:

generating an a priori probability that a first sequence of preceding bits has a particular value, the first sequence of preceding bits corresponding to an encoder state at a particular time;

applying a metric function to a test sequence that corresponds to an encoded version of a preceding sequence that includes the first sequence, wherein the metric function is a function of the a priori probability, wherein the function of the a priori probability is a function of the logarithm of the a priori probability; and employing the metric to decode the received data with a maximum likelihood sequence estimator, wherein the function of the logarithm of the a priori probability is equal to $(\sigma^2/\alpha^2)$ multiplied by the natural logarithm of the a priori probability; wherein $\sigma^2$ is an estimate of the variance of noise added by a channel through which the received data propagated and $\alpha^2$ is the average energy per symbol comprising part of the received data.

2. The method of claim 1 wherein the step of generating the a priori probability includes a step of applying a fixed a priori probability.

3. The method of claim 1 wherein the step of generating the a priori probability includes a step of adaptively estimating the a priori probability.

4. The method of claim 1 wherein the sequence of precoding bits is divided into frames.

5. The method of claim 1 wherein the received data was transmitted in a slotted mode manner.

6. The method of claim 5 wherein a current frame is decoded without receiving a previous frame.

7. The method of claim 1 wherein the received data is divided into frames, and the encoder state at the particular time is one of a plurality of states at the beginning of a frame.

8. The method of claim 1 wherein the generation of the a priori probability is based on an assumption that a certain number of consecutive bits of the first sequence comprise 0's.

9. The method of claim 1 wherein the maximum likelihood sequence estimator comprises a Viterbi decoder.

10. The method of claim 1 wherein the received data was propagated, at least in part, through a wireless channel.

11. A method for decoding received data that has been generated by encoding a sequence of precoding data with a convolutional encoder that generates convolutional codes based on an input sequence of precoding bits, the encoder characterized by a constraint length K and a rate k/n, the method comprising the steps of:

applying a first subpath metric function to a first portion of a test sequence to compute a first subpath metric, wherein the first subpath metric function is a function of an a priori probability that a sequence of precoding data has a particular value, wherein the function of the a priori probability is a function of the logarithm of the a priori probability;

applying a second subpath metric function to a second portion of the test sequence to compute a second subpath metric, the second metric function being different from the first metric function;

computing a path metric for the test sequence, the step of computing the path metric function including a step of adding together the generated first subpath metric and the generated second subpath metric; and employing the path metric to decode the received data with a maximum likelihood sequence estimator, wherein the function of the logarithm of the a priori probability is equal to $(\sigma^2/\alpha^2)$ multiplied by the natural logarithm of the a priori probability; wherein $\sigma^2$ is an estimate of the variance of noise added by a channel through which the received data propagated and $\alpha^2$ is the average energy per symbol comprising part of the received data.

12. The method of claim 11 wherein the second subpath metric function is not a function of the a priori probability.

* * * * *